(12) United States Patent
Feng et al.

(10) Patent No.: US 10,702,970 B2
(45) Date of Patent: Jul. 7, 2020

(54) POLISHING PAD AND POLISHING APPARATUS

(71) Applicant: SAN FANG CHEMICAL INDUSTRY CO., LTD., Kaohsiung (TW)

(72) Inventors: Chung-Chih Feng, Kaohsiung (TW); I-Peng Yao, Kaohsiung (TW); Lyang-Gung Wang, Kaohsiung (TW); Wei-Te Liu, Kaohsiung (TW); Wen-Chieh Wu, Kaohsiung (TW); Yung-Chang Hung, Kaohsiung (TW)

(73) Assignee: SAN FANG CHEMICAL INDUSTRY CO., LTD., Kaohsiung (TW)

(*) Notice: Subject to any disclaimer, the term of this patent is extended or adjusted under 35 U.S.C. 154(b) by 169 days.

(21) Appl. No.: 15/863,552

(22) Filed: Jan. 5, 2018

(65) Prior Publication Data
US 2018/0193974 A1 Jul. 12, 2018

(30) Foreign Application Priority Data

Jan. 6, 2017 (TW) .............................. 106100388 A

(51) Int. Cl.
*B24B 37/22* (2012.01)
*B24D 3/32* (2006.01)
*B24B 37/24* (2012.01)
*H01L 21/306* (2006.01)

(52) U.S. Cl.
CPC .............. *B24B 37/22* (2013.01); *B24B 37/24* (2013.01); *B24D 3/32* (2013.01); *H01L 21/30625* (2013.01)

(58) Field of Classification Search
CPC ........... B24B 37/22; B24B 37/24; B24D 3/32; H01L 21/30625

USPC .......................................................... 451/527
See application file for complete search history.

(56) References Cited

U.S. PATENT DOCUMENTS

| 5,212,910 A * | 5/1993 | Breivogel | B24B 37/26 451/530 |
| 5,692,950 A * | 12/1997 | Rutherford | B24B 37/22 451/285 |
| 6,422,933 B1 * | 7/2002 | Tintelnot | A47L 13/16 451/526 |
| 6,632,129 B2 * | 10/2003 | Goetz | B24B 37/22 451/527 |

(Continued)

FOREIGN PATENT DOCUMENTS

| CN | 101244545 A | 8/2008 |
| CN | 102029571 A | 4/2011 |

(Continued)

OTHER PUBLICATIONS

Office action dated Nov. 17, 2017 for the corresponding Taiwan, R.O.C. Patent Application No. 106100388.

(Continued)

*Primary Examiner* — George B Nguyen
(74) *Attorney, Agent, or Firm* — WPAT, P.C., Intellectual Property Attorneys; Anthony King

(57) ABSTRACT

The present invention relates to a polishing having a polishing layer, an elastic base layer and a binder layer. The binder layer binds the elastic base layer to the polishing layer. A compressibility of the elastic base layer is greater than a compressibility of the polishing layer. The present invention further provides a polishing apparatus and a method for polishing a substrate.

18 Claims, 3 Drawing Sheets

(56) References Cited

U.S. PATENT DOCUMENTS

| | | | | |
|---|---|---|---|---|
| 6,666,751 | B1* | 12/2003 | Wang | B24B 37/22 |
| | | | | 257/E21.23 |
| 7,025,668 | B2* | 4/2006 | Petroski | B24B 37/22 |
| | | | | 451/41 |
| 7,101,501 | B2 | 9/2006 | Shih et al. | |
| 7,335,094 | B2 | 2/2008 | Shih et al. | |
| 8,075,372 | B2* | 12/2011 | Prasad | B24B 37/26 |
| | | | | 451/527 |
| 10,071,460 | B2* | 9/2018 | Tateno | B24B 37/24 |
| 10,201,886 | B2* | 2/2019 | Sato | B24B 37/22 |
| 2002/0098790 | A1* | 7/2002 | Burke | B24B 37/24 |
| | | | | 451/528 |
| 2003/0068967 | A1* | 4/2003 | Nakamura | A47L 13/16 |
| | | | | 451/527 |
| 2004/0171338 | A1* | 9/2004 | Prasad | B24B 37/24 |
| | | | | 451/526 |
| 2005/0250431 | A1 | 10/2005 | Shih et al. | |
| 2006/0258277 | A1 | 11/2006 | Shih et al. | |
| 2008/0102741 | A1 | 5/2008 | Shih et al. | |
| 2008/0200102 | A1 | 8/2008 | Feng et al. | |
| 2009/0093200 | A1* | 4/2009 | Iwase | B24B 37/26 |
| | | | | 451/527 |
| 2009/0215363 | A1* | 8/2009 | Sung | B24B 37/24 |
| | | | | 451/56 |
| 2010/0146863 | A1 | 6/2010 | Feng et al. | |
| 2011/0045751 | A1* | 2/2011 | Feng | B24B 9/146 |
| | | | | 451/398 |
| 2012/0126472 | A1* | 5/2012 | Feng | B24B 37/30 |
| | | | | 269/289 R |
| 2013/0040543 | A1* | 2/2013 | Feng | B24B 37/22 |
| | | | | 451/527 |
| 2013/0212951 | A1* | 8/2013 | Ahn | B24D 3/32 |
| | | | | 51/296 |
| 2017/0144266 | A1 | 5/2017 | Sato et al. | |

FOREIGN PATENT DOCUMENTS

| | | |
|---|---|---|
| TW | I370758 | 12/1997 |
| TW | 201611949 | 4/2016 |

OTHER PUBLICATIONS

Search report dated Nov. 17, 2017 for the corresponding Taiwan, R.O.C. Patent Application No. 106100388.

English Translation of search report dated Nov. 17, 2017 for the corresponding Taiwan, R.O.C. Patent Application No. 106100388.

Office Action dated Jun. 4, 2019 issued by China National Intellectual Property Administration for counterpart application No. 201710303447.X.

Search Report dated Jun. 4, 2019 issued by China National Intellectual Property Administration for counterpart application No. 201710303447.X.

English translation of the Search Report dated Jun. 4, 2019 issued by China National Intellectual Property Administration for counterpart application No. 201710303447.X.

Foreign Patent Document CN101244545A Corresponds with US Patent Publication 20080200102.

Office Action dated Apr. 23, 2020 issued by China National Intellectual Property Administration for counterpart application on. 201710303447.X.

Search Report dated Apr. 23, 2020 issued by China National Intellectual Property Administration for counterpart application on. 201710303447.X.

English Translation of Search Report dated Apr. 23, 2020.

English Abstract Translation of Foreign Reference CN 102029571 A.

* cited by examiner

POLISHING PAD AND POLISHING APPARATUS

BACKGROUND OF THE INVENTION

1. Field of the Invention

The present invention relates to a polishing pad and a polishing apparatus.

2. Description of the Related Art

A polishing process generally refers to wear control of a preliminary coarse surface in a chemical mechanical polishing (CMP) process, which process includes dispersing slurry containing small particles evenly on an upper surface of a polishing pad, abutting a substrate against the polishing pad, and rubbing the substrate repeatedly in a regular motion with the polishing pad under cooperation of slurry containing small particles. The substrate may be a semiconductor, a storage medium substrate, an integrated circuit, an LCD flat-panel glass, an optical glass or a photoelectric panel. During the polishing process, since the substrate is polished by the polishing pad, the quality of the polishing pad directly influences the polishing effect on the substrate.

FIG. 1 shows a schematic view of a polishing apparatus with a conventional polishing pad. The polishing apparatus 1 includes a pressure plate 11, a mounting sheet 12, a substrate 13, a polishing plate 14, a polishing pad 15 and slurry 16. The pressure plate 11 is positioned facing the polishing plate 14. The mounting sheet 12 is adhered to the pressure plate 11 through a backside adhesive (not shown) and is used for carrying and mounting the substrate 13. The polishing pad 15 is mounted on the polishing plate 14 and faces the pressure plate 11 for polishing the substrate 13.

The operation manner of the polishing apparatus 1 is as follows. First, the substrate 13 is mounted on the mounting sheet 12, and then the pressure plate 11 and the polishing plate 14 are rotated in reverse direction, and the pressure plate 11 is simultaneously moved toward the polishing plate 14, such that the polishing pad 15 contacts the surface of the substrate 13. Accordingly, the substrate 13 is polished by the polishing pad 15 with the slurry 16 continuously supplemented.

The polishing pad must be provided with sufficient hardness and compressibility to ensure a smooth polishing process. US patent publication No. 2005/250431 discloses a single-layered polishing pad with sufficient hardness and compressibility, and a manufacturing method thereof. A density of a polishing surface of the polishing pad is different from a density of a supporting surface of the polishing pad. Such polishing pad is produced by forming a foaming resin and then slicing the foaming resin into polishing pads. The method for manufacturing the polishing pad includes filling a resin into a columnar mold, and slicing the resin into pieces when the resin cools down and is solidified. Such polishing pad which has independent pores is harder and more wearable, and is often used in high planarization polishing. However, the difference of density between the polishing surface and the supporting surface cannot be achieved easily. Moreover, after the slicing process, the unevenness of pore size of a sliced surface becomes even more obvious. Besides, due to its high hardness and low thermal compressibility of the foaming resin, such polishing pad tends to cause scratches on the substrate, thus is only suitable for coarse polishing.

In another aspect, a non-woven polishing pad is commonly used in the relevant industry, which includes a plurality of fibers and a resin. A manufacturing method of the non-woven polishing pad includes entangling the fibers (e.g., velvet fibers, synthetic suede fibers, etc.) into a non-woven fabric through non-woven processes such as carding, lapper, needle punch, etc.; impregnating the non-woven fabric in a thermoplastic polyurethane resin; and then wet-curing the polyurethane resin to form a soft and highly compressible piece. Since the non-woven polishing pad is very soft, planarization performance thereof is rather poor. Besides, such polishing pad has insufficient hardness which is not suitable for coarse polishing, and service life of the polishing pad may be short.

To overcome the aforementioned defects, a composite polishing pad has been developed, which includes a polishing layer and a buffer layer. The polishing layer includes a foaming plastic, and a main body of the buffer layer is made of a non-woven fabric or a non-woven fabric impregnated in a resin. The composite polishing pad is expected to provide favorable compressibility and recovery rate. However, the non-woven fabric usually has uneven thickness, which causes many issues. For example, when a pressure is applied on the polishing pad, different density across regions of the non-woven fabric due to the uneven thickness of the non-woven fabric may cause different compression ratio of these regions. In a region with a small compression ratio or a large thickness, a friction between the polishing layer and the substrate may be enlarged in this region, so as a wear rate in this region of the polishing pad. Additionally, the service life of the polishing pad is shorter. Due to different wear rate in each region, the surface of the polishing pad becomes more uneven, results in unstable removing rate on the surface of the substrate. Accordingly, the substrate is not sufficiently planarized, thus is recognized as a defective product. Besides, the fibers of the non-woven fabric absorb liquid part of the slurry, results in a low polishing efficiency and loose engagement between the polishing layer and the buffer layer. Furthermore, the industrial requirement for CMP becomes increasingly higher, thus the buffer layer having the non-woven main body cannot provide sufficiently compressibility to sustain the pressure during the polishing process. For polishing of a substrate having a curved surface or having a three-dimensional structure on a surface thereof, the non-woven buffer layer cannot provide sufficient buffer function. Such substrate must be polished with the conventional composite polishing pad several times in several different directions, resulting in low yield rate. Furthermore, since a total hardness of the polishing pad is rather high, the polishing pad cannot fit into recessed portions of the substrate for polishing.

Therefore, it is required to develop a novel polishing pad in the art field for overcoming the aforementioned defects and improving its polishing performance.

SUMMARY OF THE INVENTION

The present invention provides a specific elastic base layer of a polishing layer which has a specific design of pores. As such, a polishing layer disposed thereon can closely contact a surface of a substrate to be polished, thus the surface of the substrate can be highly planarized. Besides, the polishing pad can be used for polishing a curved surface of a substrate.

The invention provides a polishing pad comprising:
a polishing layer including a first polymeric elastomer and
 a plurality of first pores;

at least one elastic base layer including a second polymeric elastomer and a plurality of second pores, wherein the second pores are substantially in columnar shape, each of the second pores has a top portion and a bottom portion, the bottom portion is closed, the top portion is an opening on a surface of the elastic base layer, and a diameter of the bottom portion is greater than a diameter of the top portion; and a binder layer binding the elastic base layer to the polishing layer;

wherein a compressibility of the elastic base layer is greater than a compressibility of the polishing layer.

The invention further provides a method for polishing a substrate, comprising polishing a surface of the substrate by using the polishing pad according to the above.

The invention also provides a polishing apparatus comprising:

a polishing plate;

a substrate;

the polishing pad according to the above, which is adhered on the polishing plate and adapted for polishing the substrate; and slurry contacting with the substrate for polishing.

DETAILED DESCRIPTION OF THE INVENTION

The invention provides a polishing pad comprising:

a polishing layer including a first polymeric elastomer and a plurality of first pores;

at least one elastic base layer including a second polymeric elastomer and a plurality of second pores, wherein the second pores are substantially in columnar shape, each of the second pores has a top portion and a bottom portion, the bottom portion is closed, the top portion is an opening on a surface of the elastic base layer, and a diameter of the bottom portion is greater than a diameter of the top portion; and a binder layer binding the elastic base layer to the polishing layer;

wherein a compressibility of the elastic base layer is greater than a compressibility of the polishing layer.

The term "polishing pad" according to the present invention refers to a pad adapted for abutting against a substrate to be polished in a process of chemical mechanical polishing. The polishing pad rubs the to-be-polished substrate repeatedly in a regular motion with the cooperation of slurry containing small particles, so as to wear a preliminary coarse surface of the substrate into a smooth surface.

Figure 1:
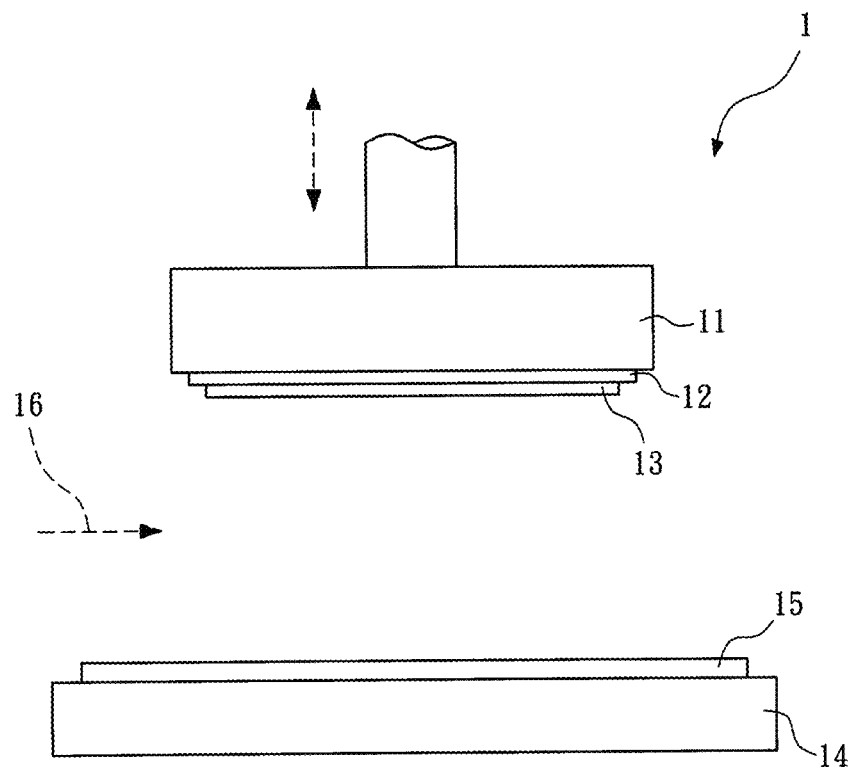
FIG. 1 shows a schematic view of a polishing apparatus having a conventional polishing pad.
Figure 2:
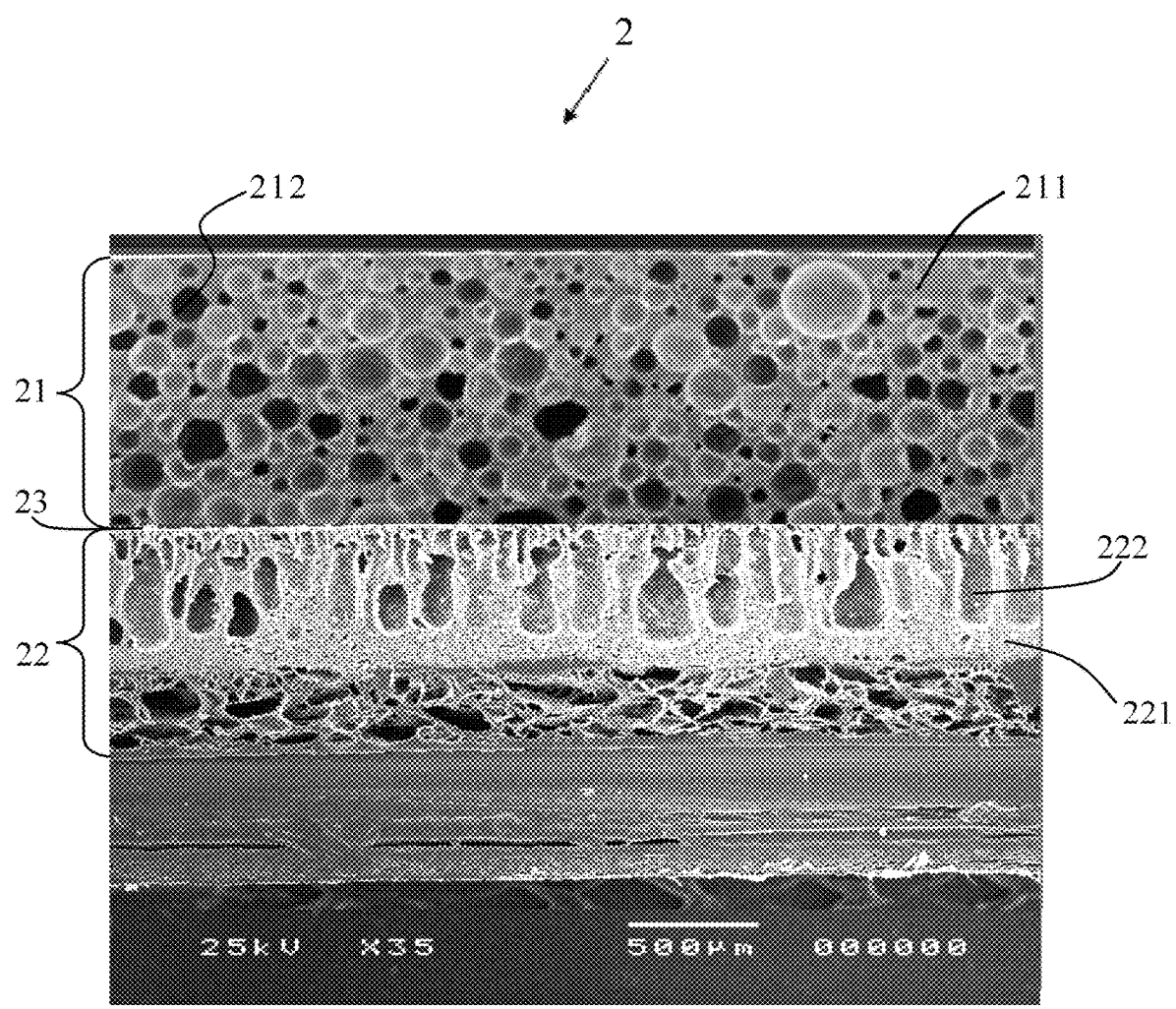
FIG. 2 shows a transmission electron microscopy (TEM) image of a cross sectional of a polishing pad according to an embodiment of the present invention.

The polishing layer of the polishing pad in the present invention is an element of a polishing pad, which element is adapted for contacting with and rubbing the substrate to be polished. That is, the polishing layer is the element which actually executes polishing with cooperation of the slurry. FIG. 2 shows a transmission electron microscopy (TEM) image of a cross-sectional view of the polishing pad 2 of the present invention. The polishing pad 2 includes a polishing layer 21. The polishing layer 21 includes a first polymeric elastomer 211 and a plurality of first pores 212.

The term "elastomer" is a type of polymer which has rubber-like characteristics. During the polishing process, the elastomer main body provides polishing function while preventing scratches on the surface of the substrate to be polished. Preferably, the elastomer is a foaming resin. The term "foaming resin" in the present invention refers to a material containing a thermoplastic resin and a thermodecomposing foaming agent.

A manner of foaming the resin according to the present invention can be chemically foaming or physically foaming, wherein the chemically foaming manner uses an agent capable of conducting a chemical reaction to yield gas, with the gas evenly distributed in the resin composition. In another aspect, the physically foaming manner includes infiltrating gas into the resin composition, and making the gas evenly distributed in the resin composition by stirring.

In a preferred embodiment of the present invention, a material of the first polymeric elastomer may include polyurethane, polyolefin, polycarbonate, polyvinyl alcohol, nylon, elastic rubber, polystyrene, poly aromatic molecules, fluorine-containing polymer, polyimide, crosslinked polyurethane, crosslinked polyolefin, polyether, polyester, polyacrylate, elastic polyethylene, polytetrafluoroethene, poly (ethylene terephthalate), poly aromatic amide, polyarylalkene, polymethyl methacrylate, a copolymer thereof, a block copolymer thereof, a mixture thereof, and a blend thereof.

In a preferred embodiment of the present invention, the first pores are defined by the first polymeric elastomer, such as foaming pores of the first polymeric elastomer. The first pores can be continuous pores or independent pores. The term "continuous pores" in the present invention refers to at least two pores connecting to each other to form a pore system similar to an ant nest, which is beneficial to flow of the slurry, distribution of the polishing particles and removal of polishing residues. The term "independent pores" in the present invention refers to pores which are independent without connecting to each other. Generally, the independent pores have cross sections of circle shape or oval shape, and are ball-shaped or egg-shaped pores. Normally, the independent pores provide greater hardness and higher removal rate.

Preferably, each of the pores 212 is independent and is not connected to each other. Further, the plurality of pores 212 is preferably ball-shaped or oval-shaped. In another aspect, according to a preferred embodiment of the present invention, the plurality of pores has a pore diameter of about 2 μm to about 250 μm, preferably about 27 μm to about 177 μm, and more preferably about 52 μm to about 127 μm.

In another aspect, a Shore D hardness of the polishing layer is about 40 D to about 60 D, preferably about 44 D to about 56 D, and more preferably about 48 D to about 52 D.

In an embodiment of the present invention, the polishing layer further includes a non-woven fabric. The non-woven fabric can be arranged above or below the elastomer main body, or can be impregnated in the elastomer composition to form the polishing layer.

The term "non-woven fabric" used in the present invention refers to a sheet, web or bat manufactured by directionally or randomly oriented fibers, bonded by friction, and/or cohesion and/or adhesion, excluding paper or products which are woven, knitted, tufted stitch bonded incorporating binding yarns or filaments, or felted by wet milling, whether or not additionally needled. The fibers may be of natural or man-made origin. They may be staple or continuous filaments or may be formed in situ. Depending on the method for forming the web, the non-woven fabric usually includes a composite non-woven fabric, a needle-punched non-woven fabric, a melt-blown non-woven fabric, a spun bonded non-woven fabric, a dry-laid non-woven fabric, a wet-laid non-woven fabric, a stitch-bonded non-woven fabric, or a spun lace non-woven fabric. Compared with a woven fabric, a non-woven fabric has a better material property.

Ordinarily skilled artisans can choose suitable kinds of fibers according to the disclosure of the specification. The term "fibers" in the present invention refers to single fibers or composite fibers, preferably composite fibers. Preferably, the fibers are made of at least one material selected from the group consisting of polyamide, terephthalamide, polyester, polymethyl methacrylate, polyethylene terephthalate, polyacrylonitrile, and a mixture thereof.

In an embodiment of the present invention, the plurality of the first pores of the polishing layer is the void spaces between the fibers of the non-woven fabric. In still another embodiment of the present invention, the plurality of pores is constructed by the elastomer main body and the fibers jointly.

In a preferred embodiment of the present invention, the polishing layer includes a plurality of polishing particles. The plurality of polishing particles is evenly distributed in the elastomer main body, as well as disposed in the plurality of pores. Preferably, the plurality of polishing particles is made of cerium dioxide, silicon dioxide, aluminum oxide, yttrium oxide, or ferric oxide. In another aspect, a particle size of the plurality of polishing particles is between about 0.01 µm to about 10 µm.

In another preferred embodiment of the present invention, the polishing layer further includes a polishing surface, and the polishing surface includes a groove. A proper processing for forming the groove on the polishing surface may be chosen by ordinarily skilled artisans based on the disclosure of the specification. For instance, laser processing can be used. The groove assists slurry flow during the polishing process. Preferably, the ratio of the groove interval and the groove width is from about 1 to about 0.05.

FIG. 2 shows a transmission electron microscopy (TEM) image of a cross-sectional view of the polishing pad 2 of the present invention. The polishing pad 2 includes an elastic base layer 22, which includes the second polymeric elastomer 221 and a plurality of second pores 222.

In a preferred embodiment of the present invention, a material of the second polymeric elastomer may include polyurethane, polyolefin, polycarbonate, polyvinyl alcohol, nylon, elastic rubber, polystyrene, poly aromatic molecules, fluorine-containing polymer, polyimide, crosslinked polyurethane, crosslinked polyolefin, polyether, polyester, polyacrylate, elastic polyethylene, polytetrafluoroethene, poly (ethylene terephthalate), poly aromatic amide, polyarylalkene, polymethyl methacrylate, a copolymer thereof, a block copolymer thereof, a mixture thereof, and a blend thereof. The material of the second polymeric elastomer may be the same as or different from the material of the first polymeric elastomer.

In an embodiments of the preset invention, when the material of the first polymeric elastomer and the material of the second polymeric elastomer belong to the same type of polymer, a total volume of the first pores is less than a total volume of the second pores, thus the compressibility of the elastic base layer can be greater than the compressibility of the polishing layer. In another embodiment of the present invention, when the material of the first polymeric elastomer and the material of the second polymeric elastomer belong to different types of polymer, a total volume of the first pores is less than a total volume of the second pores, or a compressibility of the first polymeric elastomer is less than a compressibility of the second polymeric elastomer, such that the compressibility of the elastic base layer can be greater than the compressibility of the polishing layer. For example, when the polishing pad is used in a polishing process and under a pressure along a perpendicular direction, a volume reduction ratio of the elastic base layer is greater than a volume reduction ratio of the polishing layer.

Referring to FIG. 2, the second pores 222 are substantially in columnar shape. Each of the second pores 222 has a top portion and a bottom portion, the bottom portion is closed, the top portion is an opening on a surface of the elastic base layer 22, and a diameter of the bottom portion is greater than a diameter of the top portion. Preferably, the second pores 222 are independent and the second pores are not continuous with each other.

In an embodiment of the present invention, the polishing pad includes more than one elastic base layer. For example, the polishing pad may include a plurality of elastic base layer stacked together along a perpendicular direction. In an embodiment of the present invention, a "perpendicular direction" refers to a direction perpendicular to a surface of the polishing pad, a surface of the polishing layer and/or a surface of the elastic base layer.

It is believed, though not intended to be restricted by any theoretical, that the second pores substantially in columnar shape can provide the elastic base layer with a perpendicular compressibility greater than a horizontal compressibility. Hence, the elastic base layer can afford the pressure along a perpendicular direction from the polishing plate and the pressure plate, and provide the compressibility of the elastic base layer greater than the compressibility of the polishing layer at least in the perpendicular direction. In another aspect, the structure of the top portion and the bottom portion of the second pores provides the elastic base layer with sufficient support function. When the elastic base layer is adhered by a binder layer to the polishing layer, a large contacting area can enhance the engagement therebetween, preventing delamination of the elastic base layer from the polishing layer during the polishing process. Besides, since the elastic base layer provides excellent compressibility, support function and engagement strength, the polishing layer can fit into recessed portions of the substrate to be polished, thus improve surface flatness of a polished surface of the substrate. The polishing pad can be used for polishing the substrate with a curved surface, or a surface having a three-dimensional (3D) structure disposed thereon. For example, the three-dimensional structure may be a protrusion or a recess of the surface of the substrate, or may be a component or an element attached to the surface of the substrate. The polishing pad may polish merely the surface on which the three-dimensional structure is disposed, or both the three-dimensional structure and the surface, while not removing or eliminating the three-dimensional structure. That is, such three-dimensional structure may still remain on the surface of the substrate after a polishing process.

In an embodiment of the present invention, a length of the second pores along a perpendicular direction (e.g., a direction perpendicular to the surface of the elastic base layer) may be about 400 µm to about 1100 µm, preferably about 550 µm to about 950 µm, more preferably about 650 µm to about 850 µm.

In a preferred embodiment of the present invention, a compressibility of the elastic base layer is about 35% to about 65%, preferably about 35% to about 60%, more preferably about 45% to about 55%.

Referring to FIG. 2, the binder layer 23 binds the elastic base layer to the polishing layer. Preferably, a material of the binder layer is selected from a group consisting of pressure-sensitive adhesive, one-part adhesive, two-part adhesive, polyol curing-type PU paste, acrylic resin, and epoxy resin. The pressure-sensitive adhesive generally includes a supporting film which can be, for instance, a polyester film. A fluidic adhesive agent is coated on upper and lower sides of the supporting film. In some embodiments, the supporting film may be provided with low permeability, so as to prevent the adhesive on the upper side thereof from permeating to the lower side thereof. Preferably, the supporting film is nonporous, and the upper and the lower sides thereof are smooth. The one-part adhesive refers to an adhesive agent which utilizes an elastomer with high molecular weight for providing adhesion function, preferably includes polyurethane. The one-part adhesive includes oil-modified paste and moisture-curing paste. The oil-modified paste is formed by reacting natural oil-modified or diglyceride-modified polyols with toluene diisocyanate (TDI). The moisture-curing paste includes hydroxyl-containing polyesters and polyethers, with excess NCO groups (NCO/OH>1) reacting with hydroxyl groups of toluene diisocyanate, diphenylmethane diisocyanate (MDI), hexamethylene diisocyanate (HMDI), etc., to form isocyanate-terminated prepolymers. Such isocyanate groups can react with moisture in the air to produce amines, which undergoes further reactions to form urea linkage and biuret, thus forming a cured film. The two-part adhesive refers to an adhesive agent including two components which react or crosslink with each other to provide adhesion function; preferably includes an elastomer and polyisocyanate. The two-part adhesive may be of catalyst-curing type, which is cured by reacting a mono-diglyceride mixture transesterified by polyethylene glycol, polypropylene glycol or polyol with a catalyst, such as tertiary amines or metal salts. The polyolcuring-type PU paste may be formed by reacting isocyanate prepolymers and a hydroxyl group of polyol-esters or polyethers or polyols, such as hydroxyl-containing acrylic resins. The acrylic resin may be cold curing type or dry-heat curing type. The cold curing-type acrylic resin, which can be cured under room temperature, is essentially composed of acrylic resin monomers. The heat-dry curing-type acrylic resin includes acrylic resin polymers as the basic structure, with active reacting groups introduced therein. When heated, said resin alone or with a resin containing reacting groups and crosslinking agent undergo a reaction to form a 3D network structure. The epoxy resin can form 3D network structure with the addition of the crosslinking agent.

In an embodiment of the present invention, the polishing layer and the elastic base layer are produced separately, and then bound together by the binder layer. Means for binding the polishing layer to the elastic base layer can be varied according to the forms of the binder layer. The binder layer for binding the polishing layer and the elastic base layer is preferably applied on a surface of the elastic base layer or the polishing layer by coating, transferring, printing or scraping, more preferably by coating on a surface of the elastic base layer or the polishing layer.

Preferably, the polishing pad further includes a film with low permeability. The term "film with low permeability" in the present invention refers to a film or a thin membrane which substantially prevents the second polymeric elastomer on an upper surface thereof from permeating to a lower surface thereof. Preferably, the film with low permeability is nonporous, and is provided with a smooth surface. Preferably, a material of the film with low permeability includes polyethylene terephthalate, polypropylene, polycarbonate and polyethylene. Additionally, the preferable polypropylene is oriented polypropylene. In an embodiment, the elastic base layer has a first surface binding to the polishing layer and a second surface opposite the first surface, and the film with low permeability contacts the second surface of the elastic base layer.

In another preferred embodiment of the present invention, the polishing pad further includes an adhesive layer on a surface of the polishing layer. In an embodiment of the present invention, the film with low permeability has a first surface contacting the elastic base layer and a second surface opposite the first surface, and the adhesive layer contacts the second surface of the film with low permeability. The adhesive layer may be adapted for adhering the polishing pad on a polishing plate. A material of the adhesive layer can be the same as, or similar to, the material of the binder layer, thus is not repeated again. Preferably, the adhesive layer includes pressure-sensitive adhesive or polyurethane.

The present invention further provides a method for polishing a substrate, comprising polishing a surface of the substrate by using the polishing pad according to the above. Preferably, the surface of the substrate is curved or includes 3D structure disposed thereon.

The present invention also provides a polishing apparatus, including:
 a polishing plate;
 a substrate;
 a polishing pad adhered on the polishing plate and adapted for polishing the substrate; and
 slurry contacting with the substrate for polishing.

Figure 3:
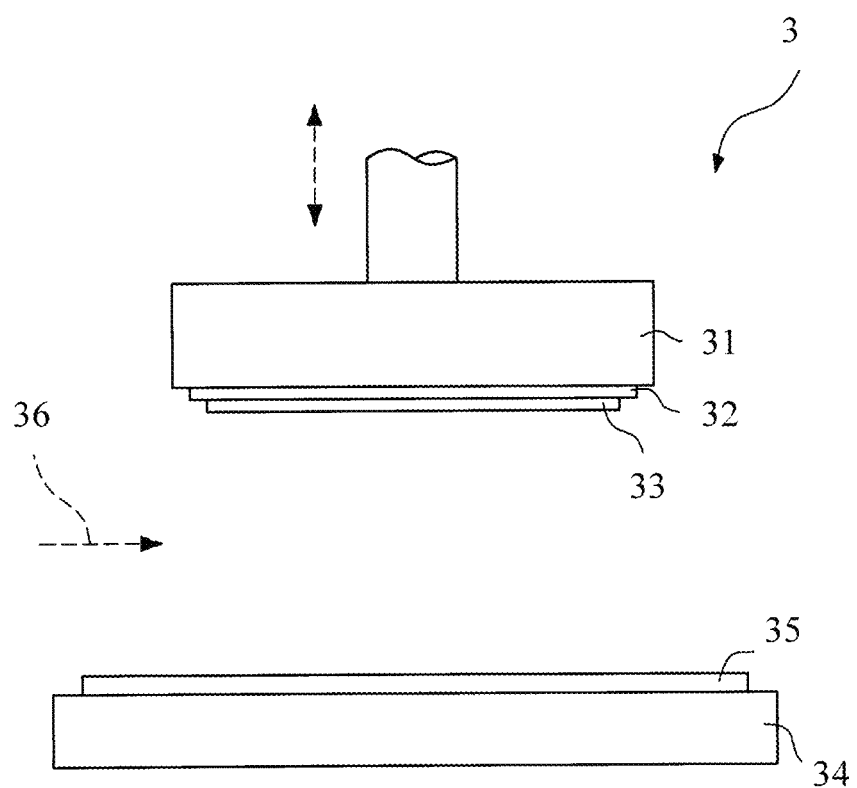
FIG. 3 shows a schematic view of a polishing apparatus having the polishing pad according to the present invention.

FIG. 3 shows a schematic view of a polishing apparatus according to the polishing pad of the invention. The polishing apparatus 3 includes a pressure plate 31, a mounting sheet 32, a substrate 33, a polishing plate 34, a polishing pad 35 and slurry 36. The pressure plate 31 is positioned facing the polishing plate 34. The mounting sheet 32 is adhered to the pressure plate 31 through a backside adhesive (not shown) and is used for carrying and mounting the substrate 33. The polishing pad 35 is mounted on the polishing plate 34 and faces the pressure plate 31 for polishing the substrate 33.

The operation manner of the polishing apparatus 3 is as follows. First, the substrate 33 is mounted on the mounting sheet 32, and then the pressure plate 31 and the polishing plate 34 are rotated in reverse directions and the pressure plate 31 is simultaneously moved toward the polishing plate 34, such that the polishing pad 35 contacts the surface of the substrate 33. Accordingly, the substrate 33 can be polished by the polishing pad 45 with the continuously supplemented slurry 36.

While embodiments of the present invention have been illustrated and described, various modifications and improvements can be made by persons skilled in the art. It is intended that the present invention is not limited to the particular forms as illustrated, and that all modifications not departing from the spirit and scope of the present invention are within the scope as defined in the following claims.

What is claimed is:

1. A polishing pad comprising:
 a polishing layer including a first polymeric elastomer and a plurality of first pores;
 at least one elastic base layer including a second polymeric elastomer and a plurality of second pores, wherein the second pores are substantially in columnar shape, each of the second pores has a top portion and a bottom portion, the bottom portion is closed, the top portion is an opening on a surface of the elastic base layer, and a diameter of the bottom portion is greater than a diameter of the top portion; and a binder layer binding the elastic base layer to the polishing layer;

wherein a compressibility of the elastic base layer is greater than a compressibility of the polishing layer; and further includes a film with low permeability, wherein the elastic base layer has a first surface binding to the polishing layer and a second surface opposite the first surface, and the film with low permeability contacts the second surface of the elastic base layer.

2. The polishing pad according to claim 1, wherein each of the first pores is independent and the first pores are not connected to each other.

3. The polishing pad according to claim 1, wherein each of the second pores is independent and not connected to each other.

4. The polishing pad according to claim 1, wherein the first pores are in a ball shape or an oval shape.

5. The polishing pad according to claim 1, wherein the polishing layer further includes a non-woven fabric.

6. The polishing pad according to claim 1, which includes a plurality of elastic base layers.

7. The polishing pad according to claim 1, further includes an adhesive layer, wherein the film with low permeability has a first surface contacting the elastic base layer and a second surface opposite the first surface, and the adhesive layer contacts the second surface of the film with low permeability.

8. A method for polishing a substrate, comprising polishing a surface of the substrate by using the polishing pad according to claim 1.

9. The method for polishing a substrate according to claim 8, wherein the surface of the substrate is curved.

10. The method for polishing a substrate according to claim 8, wherein the surface of the substrate includes 3D structure disposed thereon.

11. A polishing apparatus comprising:
a polishing plate;
a substrate;
the polishing pad according to claim 1, which is adhered on the polishing plate and adapted for polishing the substrate; and
slurry contacting the substrate for polishing; and
further includes a film with low permeability, wherein the elastic base layer has a first surface binding to the polishing layer and a second surface opposite the first surface, and the film with low permeability contacts the second surface of the elastic base layer.

12. The polishing apparatus according to claim 11, wherein the surface of the substrate is curved.

13. The polishing apparatus according to claim 11, wherein the surface of the substrate includes a three-dimensional structure disposed thereon.

14. The polishing apparatus according to claim 11, wherein each of the first pores or the second pores is independent and the first pores or the second pores are not connected to each other.

15. The polishing apparatus according to claim 11, wherein the first pores are in a ball shape or an oval shape.

16. The polishing apparatus according to claim 11, wherein the polishing layer further includes a non-woven fabric.

17. The polishing apparatus according to claim 11, which includes a plurality of elastic base layers.

18. The polishing apparatus according to claim 11, further includes an adhesive layer, wherein the film with low permeability has a first surface contacting the elastic base layer and a second surface opposite the first surface, and the adhesive layer contacts the second surface of the film with low permeability.

* * * * *